DUO RESIST PROCESS

Filed Jan. 2, 1964

INVENTOR.
ROBERT L. REBER
BY
[signature]
ATTORNEY

United States Patent Office 3,317,320

Patented May 2, 1967

3,317,320

DUO RESIST PROCESS

Robert L. Reber, Eatontown, N.J., assignor to The Bendix Corporation, Eatontown, N.J., a corporation of Delaware Filed Jan. 2, 1964, Ser. No. 335,169
1 Claim. (Cl. 96—36.2)

Figures 1, 2, 3, 4, 5, 6, 7, 8:
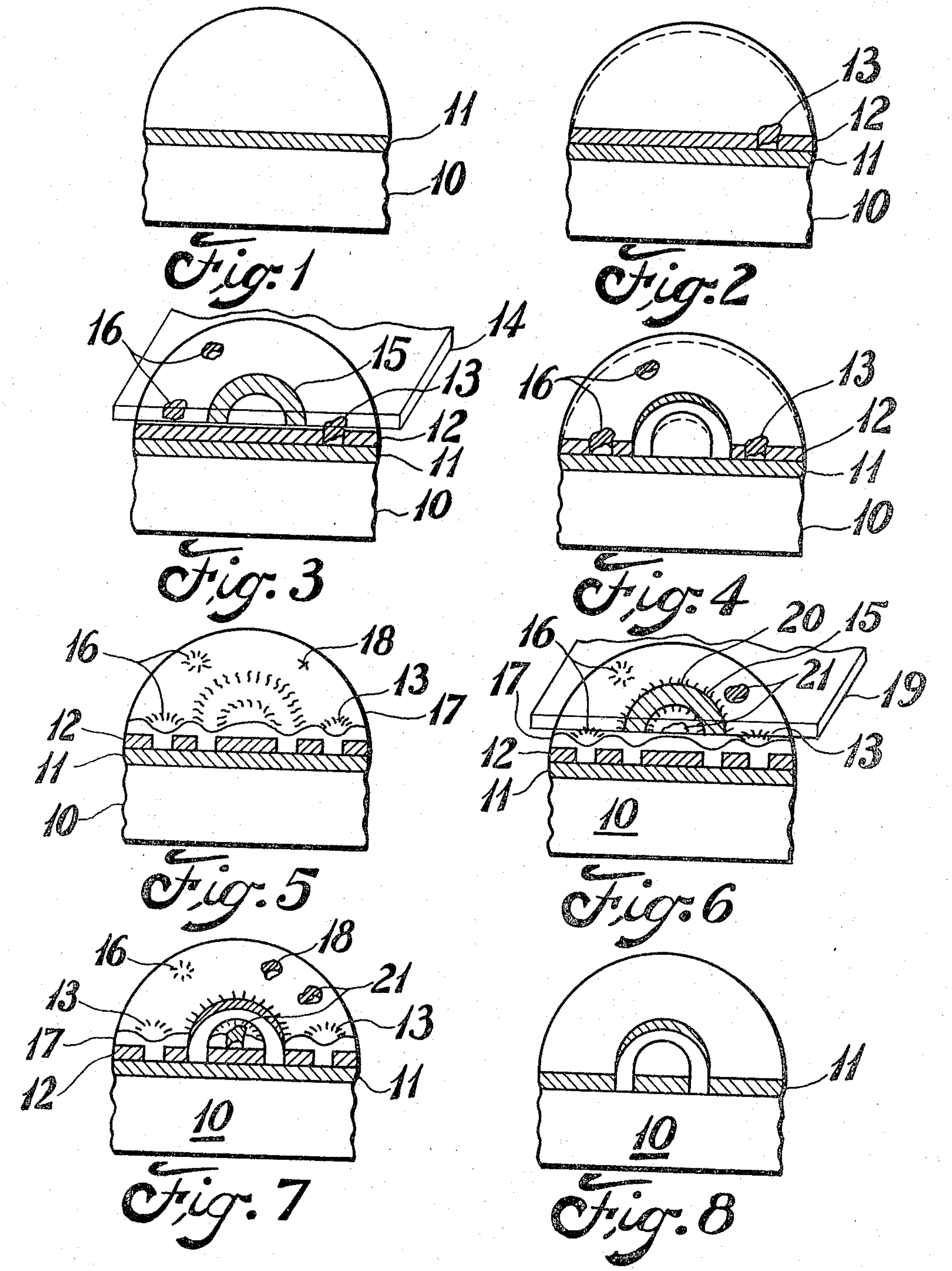

The present invention relates to semiconductor devices and more particularly to the formation of images by photo-etching and related photo fabrication techniques.

Conventional photo fabrication techniques are never perfect. In order to have sharp lines, it is necessary that the photo resist be quite thin as a thick coating cannot be used without sacrificing edge definitiveness and reproduction accuracy. Thus, flaws that occur in the resist and also flaws in the mask are reproduced during exposure and processing.

The present invention provides a duo resist process in which the definition of a thin coating and the etch resistance of a thick coating is obtained while compensating for any imperfections in the coating (pin holes and flaws). Also it provides compensation for imperfections in the exposure, for example, masks flaws such as dust, scratches and other imperfections.

It is an object of the invention to provide an improved photo-etching process for semiconductors.

Another object of the invention is to provide a process which will increase the yield in semiconductor processing.

Another object of the invention is to provide an improved photo resist process for semiconductor fabrication.

Another object of the invention is to provide novel means for correcting flaws in a photo-resist process.

The above and other objects and features of the invention will appear more fully hereinafter from a consideration of the following description taken in connection with the accompanying drawing, wherein one mode is illustrated by way of example.

In the drawing:

FIGURES 1 through 8 are sectional views of a device illustrating the steps of the process.

Referring now to the drawing in FIGURE 1, a substrate is indicated generally by the numeral 10 and may be of any suitable type. A layer of metal or oxide 11 is formed on the substrate 10 by vapor deposition or any other conventional method.

In order to fabricate the desired device, it is necessary to etch a predetermined geometry into the layer 11 on the substrate 10 and maintain a perfect surface elsewhere in the layer 11. A photo-resist coating 12 is applied by any conventional technique such as are described by Kodak in their technical handbook "Kodak Photo Sensitive Resist for Industry." See FIGURE 2. Normally the coating 12 contains minute flaws indicated by the numeral 13.

Referring now to FIGURE 3, a mask 14 containing a desired image 15 is placed over the resist coating 12. Also, the mask 14 may have minute flaws indicated by the numeral 16. The flaws 16 may be scratches, dust or other imperfections. The resist coating 12 is now exposed to the proper light in a conventional manner.

The mask 14 is now removed and the coated substrate 10 is developed and processed in a conventional manner. It is noted that not only is the geometry 15 reproduced but the flaws 13 and 16 are also reproduced.

Normally the layer 11 would be etched at this point which would also reproduce the flaws 13 and 16 as well as the desired geometry 15 in the layer 11. Instead of etching at this time a second resist coating 17 is applied over the first coating 12, see FIGURE 5.

The solvents in the second coating 17 will not affect the first coating 12, as, at this time it has been exposed and developed. The second coating 17 will fill in the flaws 13 and 16 as well as the geometry 15 but will produce flaws 18.

Moving now to FIGURE 6, a second mask 19 is aligned so that a geometry 20 coincides with the desired pattern as produced by the first mask 14. The mask 19 as did the mask 14, will have random flaws 21. The mask 20 will be a different mask than the mask 14 even though the geometries are similar. By using two distinct masks it can readily be assumed that a different random flaw pattern exists on each mask.

The second coating is now exposed to the proper light and developed. The desired geometry is reproduced in the second coating. It is noted, however, that the flaws 13 and 16 were not reproduced, nor were the flaws 18 and 21 reproduced. The surface 11 will be protected by either coating 12 or coating 17 except where desired by the geometry.

The coating 11 is now etched as shown in FIGURE 8 leaving the surface, other than the geometry or pattern, free of flaws and pin holes. In other words, the geometry is reproduced but the flaws are not reproduced.

As has been set forth above, there are the two types of flaws, those in the resist coatings and those in the masks. While the two resist coatings are necessary to correct for the flaws in the coatings, the mask flaws could be corrected by two exposures using different masks. A first exposure would be made, then the mask changed and a second exposure made before developing.

Although this invention has been disclosed and illustrated to particular applications, the principles involved are susceptible of numerous other applications which will be apparent to persons skilled in the art.

What is claimed is:

A method of etching an image on a semiconductor wafer comprising the steps of:

coating the wafer with a photo sensitive resist
covering said wafer with a first mask having a predetermined image
exposing to light through said first mask
developing and removing unexposed resist
aligning and remasking with a second mask having the same predetermined image as said first mask
reexposing to light through said second mask redeveloping, and
etching to form the predetermined image on said wafer.

References Cited by the Examiner

UNITED STATES PATENTS 2,673,823 3/1954 Biefeld et al. -------- 161—94

OTHER REFERENCES

E. Stanton on Printed Circuits—Photo Methods for Industry, June 1959, pp. 46, 47, 67.

Nall et al.: Use of Photo Techniques in Transistor Fabrication, Diamond Ordnance Fuse Lab., Wash., D.C., June 1, 1958, AD 159,233 Reprod. by Armed Services Technical Info Agency, Arlington, Va., pp. 5, 6, 8, 11, 13.

JACOB H. STEINBERG, *Primary Examiner.*